United States Patent
Nakahashi et al.

(10) Patent No.: US 11,749,491 B2
(45) Date of Patent: Sep. 5, 2023

(54) ELECTRON BEAM WRITING APPARATUS AND CATHODE LIFE SPAN PREDICTION METHOD

(71) Applicant: NUFLARE TECHNOLOGY, INC., Yokohama (JP)

(72) Inventors: Satoshi Nakahashi, Yokohama (JP); Nobuo Miyamoto, Yokohama (JP); Takahito Nakayama, Chigasaki (JP); Shunji Shinkawa, Fujisawa (JP)

(73) Assignee: NUFLARE TECHNOLOGY, INC., Yokohama (JP)

( * ) Notice: Subject to any disclaimer, the term of this patent is extended or adjusted under 35 U.S.C. 154(b) by 0 days.

(21) Appl. No.: 17/577,630

(22) Filed: Jan. 18, 2022

(65) Prior Publication Data
US 2022/0230834 A1    Jul. 21, 2022

(30) Foreign Application Priority Data

Jan. 21, 2021  (JP) ................................ 2021-008117
Dec. 20, 2021  (JP) ................................ 2021-206375

(51) Int. Cl.
*H01J 37/073*    (2006.01)
*H01J 37/317*    (2006.01)

(52) U.S. Cl.
CPC ........ *H01J 37/073* (2013.01); *H01J 37/3174* (2013.01); *H01J 2237/06333* (2013.01)

(58) Field of Classification Search
CPC ................. H01J 37/073; H01J 37/3174; H01J 2237/06333
See application file for complete search history.

(56) References Cited

U.S. PATENT DOCUMENTS

| | | | |
|---|---|---|---|
| 7,034,543 B2 * | 4/2006 | Iwasawa | H01J 37/08 324/525 |
| 2012/0101742 A1 * | 4/2012 | Low | H01J 37/3171 702/34 |
| 2015/0034835 A1 * | 2/2015 | Matsunaga | H01J 37/3045 250/397 |
| 2018/0068828 A1 * | 3/2018 | Hailing | H01J 37/147 |

FOREIGN PATENT DOCUMENTS

| | | |
|---|---|---|
| JP | 2010-219372 | 9/2010 |
| JP | 2016-152251 | 8/2016 |
| JP | 2018-098935 | 6/2018 |
| JP | 2021-086658 | 6/2021 |
| JP | 2022-112487 | 8/2022 |

* cited by examiner

*Primary Examiner* — Sean M Luck
(74) *Attorney, Agent, or Firm* — Oblon, McClelland, Maier & Neustadt, L.L.P.

(57) ABSTRACT

An electron beam writing apparatus comprising, a cathode configured to emit an electron beam, a condition controller configured to change a condition under which the electron beam is emitted from the cathode in a plurality of ways, and a prediction unit configured to predict a life span of the cathode based on a temporal change in an amount of fluctuation of a beam characteristic of the electron beam to a change in the condition when the condition is changed.

20 Claims, 6 Drawing Sheets

ELECTRON BEAM WRITING APPARATUS AND CATHODE LIFE SPAN PREDICTION METHOD

CROSS REFERENCE TO RELATED APPLICATIONS

This application is based upon and claims the benefit of priority from the prior Japanese Patent Application No. 2021-8117, filed on Jan. 21, 2021 and No. 2021-206375, filed on Dec. 20, 2021, the entire contents of which are incorporated herein by reference.

FIELD

An embodiment of the present invention relates to an electron beam writing apparatus and a cathode life span prediction method.

BACKGROUND

In recent years, with the miniaturization of semiconductor devices, a shot size of an electron beam for forming a pattern on a mask has decreased. As the shot size decreases, the throughput of mask lithography decreases. In order to improve the throughput, it is necessary to increase the current density of an electron beam on a sample surface, and in order to increase the current density, it is necessary to increase an emission current carried through a cathode emitting an electron beam.

Since an increase in the emission current shortens the life span of the cathode, it is necessary to accurately predict when the cathode will reach its life span. Conventionally, the life span of the cathode is predicted by detecting the current distribution of an aperture and an emission current. However, in the conventional method, there is the case in which it is noticed that the cathode reaches its life span after the emission current rapidly decreases, and it is not possible to accurately predict the time at which the cathode reaches its life span in advance.

DETAILED DESCRIPTION

In the following, an embodiment of an electron beam writing apparatus and a cathode life span prediction method will be described with reference to the drawings. In the following, although the main components of the electron beam writing apparatus and the cathode life span prediction method will be mainly described, the electron beam writing apparatus and the cathode life span prediction method may have components and functions that are not shown or described. The following description does not exclude components and functions that are not shown or described.

Figure 1:
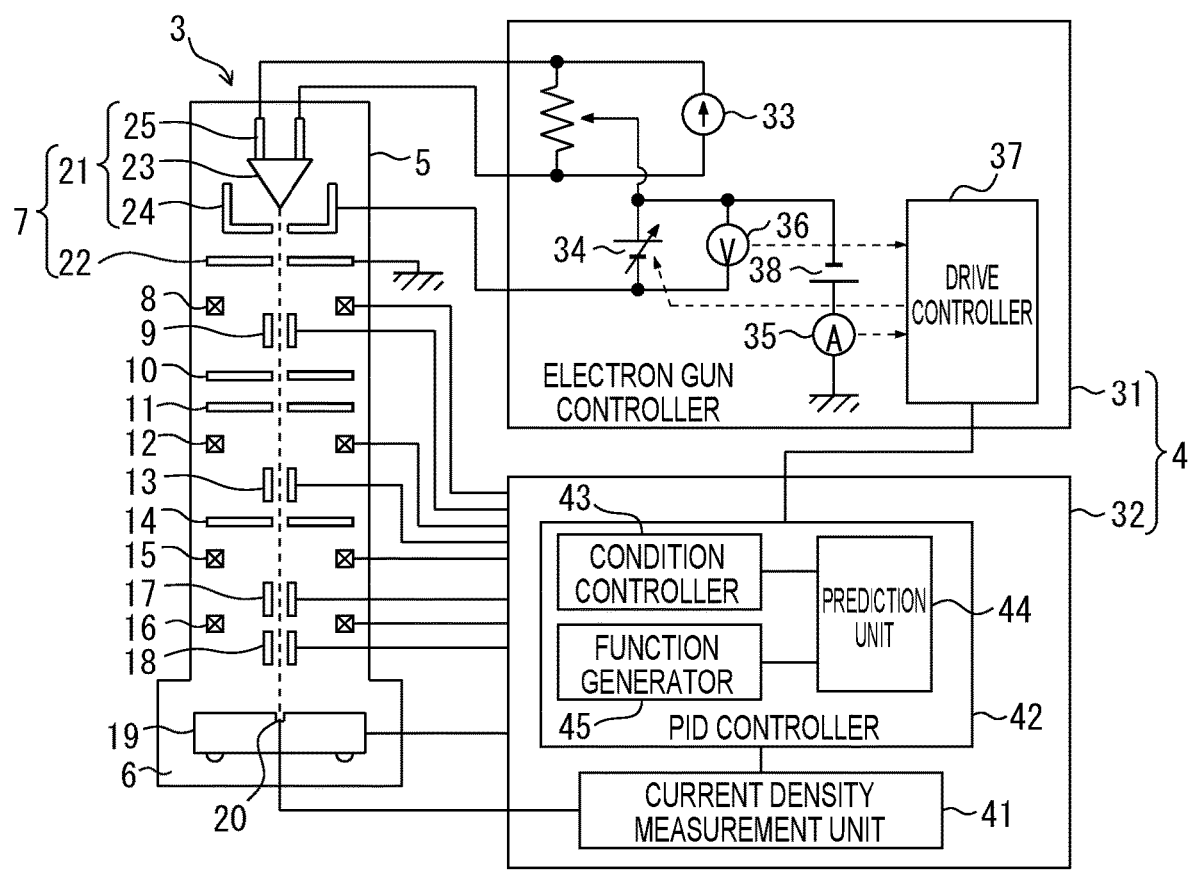
FIG. 1 is a block diagram showing a schematic configuration of an electron beam writing apparatus according to an embodiment.

FIG. 1 is a block diagram showing a schematic configuration of an electron beam writing apparatus 2 according to an embodiment. The electron beam writing apparatus 2 in FIG. 1 includes a pattern generator 3 and a controller 4. The pattern generator 3 draws a desired pattern on a sample. The controller 4 controls the pattern generator 3.

The pattern generator 3 has an electron optical column 5 and a pattern generation chamber 6. In the inside of the electron optical column 5, an electron gun 7, an illumination lens 8, a blanking deflector 9, a blanking aperture 10, a first shaping aperture 11, a shaping lens 12, a shaping deflector 13, a second shaping aperture 14, a reducing glass 15, an objective lens 16, a secondary deflector 17, and a primary deflector 18 are provided. In the inside of the pattern generation chamber 6, an XY stage 19 movably disposed is provided. The XY stage 19 is provided with a beam absorbing electrode (Faraday cup) 20 that measures the current of an electron beam to be applied. On the XY stage 19, a sample that is a target for pattern generation is placed. The sample is a mask substrate for exposure that transfers a pattern to a semiconductor wafer. With the use of the semiconductor wafer as a sample, a pattern may be directly written on the semiconductor wafer. The electron gun 7 has a cathode 21 and an anode 22. The cathode 21 has an emitter 23, a Wehnelt electrode 24, and a pair of filaments 25. Across the pair of filaments 25, a high voltage is applied. The emitter 23 is connected to one end of each of the pair of filaments 25. The Wehnelt electrode 24 is disposed opposite to the emitter 23. The anode 22 is grounded.

The controller 4 has an electron gun controller 31 and a pattern generation controller 32. The electron gun controller 31 has a constant current source 33, a variable voltage source 34, an ammeter 35, a voltmeter 36, and a drive controller 37. The constant current source 33 carries a predetermined heating current to both poles of the emitter 23. The variable voltage source 34 applies a predetermined bias voltage (Wehnelt voltage) across the intermediate voltage node of both poles of the emitter 23 and the Wehnelt electrode 24. The ammeter 35 is connected to one end side of the variable voltage source 34 through a DC voltage source 38. The ammeter 35 measures an emission current carried through the cathode 21. In addition, the voltmeter 36 is connected in parallel to the variable voltage source 34. The voltmeter 36 measures the bias voltage (Wehnelt voltage) described above. The drive controller 37 monitors the measurement results of the ammeter 35 and the voltmeter 36, and controls the variable voltage source 34 based on the output signal of the pattern generation controller 32.

The pattern generation controller 32 has a current density measurement unit 41 and a PID controller 42. The current density measurement unit 41 measures the current density of a sample surface. The PID controller 42 calculates the target value of the emission current based on the current density of the sample surface measured by the current density measurement unit 41. The calculated target value is sent to the drive controller 37. The drive controller 37 controls the variable voltage source 34 based on the target value received from the PID controller 42. More specifically, the drive controller 37 performs the feedback control of the bias voltage based on the target value.

The PID controller 42 has a condition controller 43 and a prediction unit 44. The condition controller 43 changes a plurality of conditions (in the following, also referred to as a cathode condition) that emits an electron beam from the cathode 21. The cathode condition includes, for example, at least one of an emission current carried through the emitter 23, a bias voltage applied to the filament 25, filament power supplied to the filament 25, and a temperature of the filament 25.

The prediction unit 44 predicts the life span of the cathode 21 based on a temporal change in the amount of fluctuation of the beam characteristic of the electron beam to a variation in the cathode condition when the cathode condition is changed in a plurality of ways. The temporal change in the amount of fluctuation of the beam characteristic refers to the amount of fluctuation of the beam characteristic in the minimum unit of control of the high-voltage power supply that supplies power to the cathode 21. Specifically, a temporal change in the amount of fluctuation of the beam characteristic includes at least one of the amount of transmitted electrons of the aperture, the amount of the current of reflected electrons, the amount of the current of secondary electrons, and a variation in the bias voltage applied to the filament 25 of the cathode 21.

The prediction unit 44 predicts the life span of the cathode 21 based on, for example, a temporal change in the amount of fluctuation of the beam characteristic to a variation in the cathode condition. In this case, the PID controller 42 may have a function generator 45. The function generator 45 generates a function that obtains a temporal change in the amount of fluctuation of the beam characteristic of the electron beam to a change in the cathode condition at an arbitrary time based on a temporal change in the amount of fluctuation of the beam characteristic of the electron beam to a change in the cathode condition at each of the plurality of times. The prediction unit 44 determines that the life span of the cathode 21 reaches the time at which a temporal change in the amount of fluctuation of the beam characteristic of the electron beam to a change in the cathode condition obtained by the function becomes a predetermined threshold.

Here, in the case in which a temporal change in the amount of fluctuation of the beam characteristic is represented by an absolute value, the prediction unit 44 determines that the life span of the cathode 21 is reached at a time at which a temporal change in the amount of fluctuation becomes equal to or greater than a predetermined threshold. In addition, in the case in which a direction in which a temporal change in the amount of fluctuation becomes larger is a positive value, it is determined that the life span of the cathode 21 is reached at a time at which a temporal change in the amount of fluctuation becomes equal to or greater than a predetermined threshold. On the other hand, in the case in which the direction in which a temporal change in the amount of fluctuation becomes larger is a negative value, it is determined that the life span of the cathode 21 is reached at the time at which a temporal change in the amount of fluctuation becomes equal to or less than the predetermined threshold.

Alternatively, the prediction unit 44 may predict the life span of the cathode 21 based on a temporal change in the amount of fluctuation of the beam characteristic when the cathode condition is changed. In this case, the function generator 45 in the PID controller 42 generates a function that obtains the absolute value of the amount of fluctuation of the beam characteristic when the condition is changed at each of the plurality of times. The prediction unit 44 determines that the life span of the cathode 21 is reached at the time at which the amount of fluctuation of the beam characteristic obtained by the function becomes the threshold.

Figure 2:
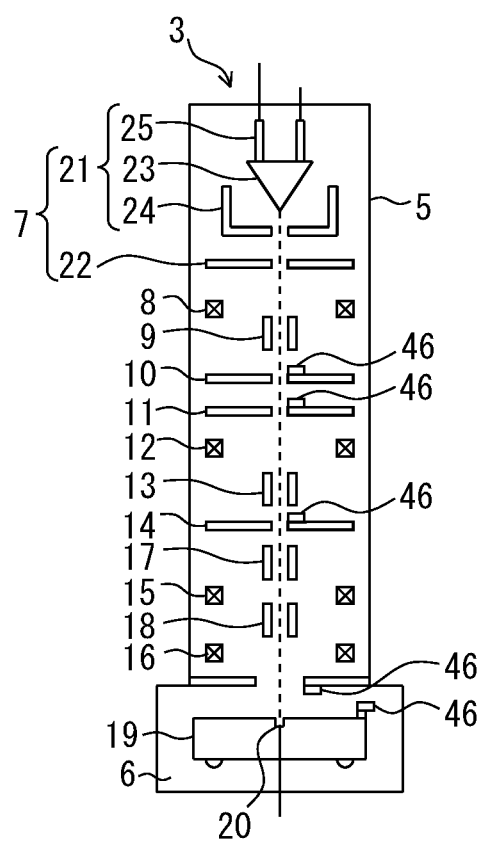
FIG. 2 is a diagram showing an example of installation locations of an electron optical column and a plurality of detectors provided in a pattern generation chamber.

At a plurality of places of the electron optical column 5 and the pattern generation chamber 6, a plurality of detectors 46 is provided. FIG. 2 is a diagram showing an example of installation locations of the electron optical column 5 and the plurality of detectors 46 provided in the pattern generation chamber 6. In the example in FIG. 2, the detector 46 is provided on each of the blanking aperture 10, the first shaping aperture 11, the second shaping aperture 14, and the lower surface side of the objective lens 16 in the electron optical column 5, and the detector 46 is also provided on the sample surface. The detector 46 in the electron optical column 5 detects the amount of transmitted electrons, the amount of reflected electrons, or the amount of secondary electrons in each aperture. The detector 46 on the sample surface detects the amount of the current of reflected electrons or secondary electrons on the sample surface. The prediction unit 44 detects a temporal change in the ratio of the amount of fluctuation of the beam characteristic based on the detection currents of the detectors 46.

Each of configurations or functions of the controller 4 may be configured by hardware such as circuitry or may be configured by software. When the functions are configured by the software, a program for realizing at least a part of the functions of the controller 4 may be stored in a recording medium such as a CD-ROM and read and executed by a computer. The recording medium is not limited to a detachable recording medium such as a magnetic disk or an optical disk and may be a fixed recording medium such as a hard disk device or a memory.

The prediction unit 44 described above predicts the life span of the cathode 21 in advance by, for example, a first prediction method or a second prediction method. In the following, the first prediction method and the second prediction method will be sequentially described.

First Prediction Method

Figure 3A:
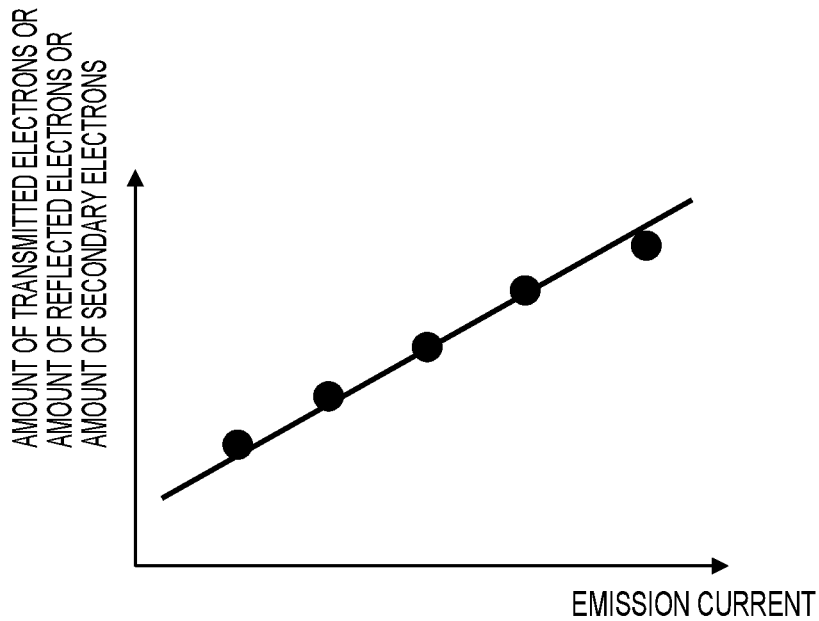
FIG. 3A is a graph plotting a correspondence relationship between cathode conditions and beam characteristics.
Figure 3B:
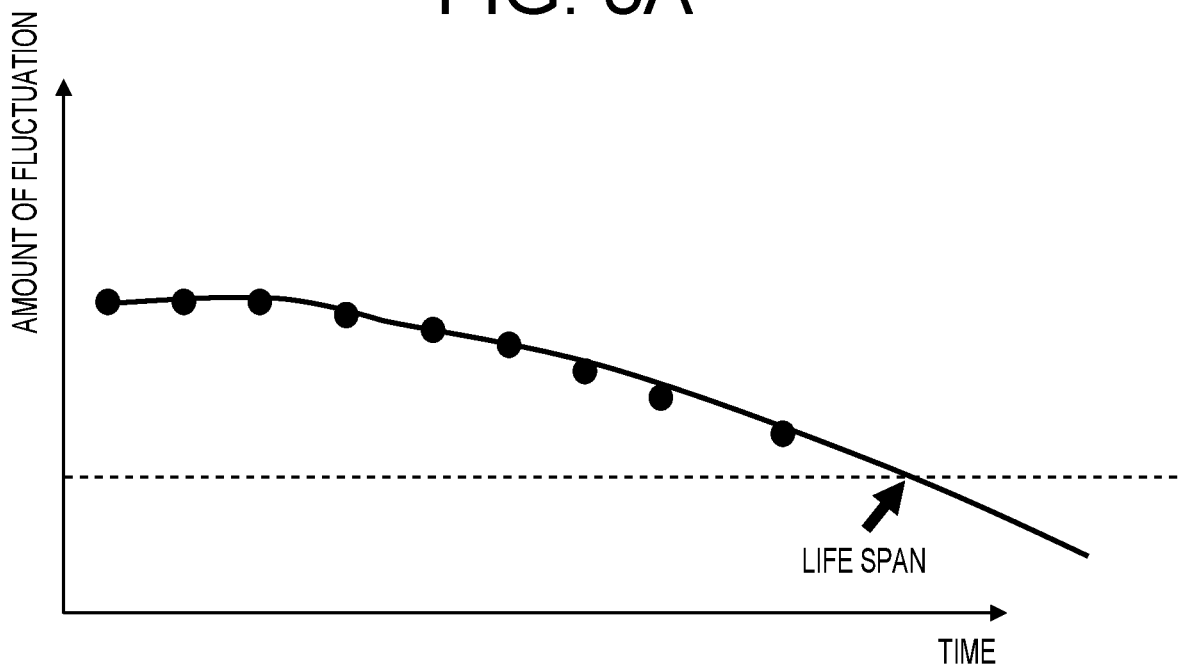
FIG. 3B is a graph plotting a correspondence relationship between the time at which the amount of fluctuation in FIG. 3A is obtained and the amount of fluctuation.
Figure 4:
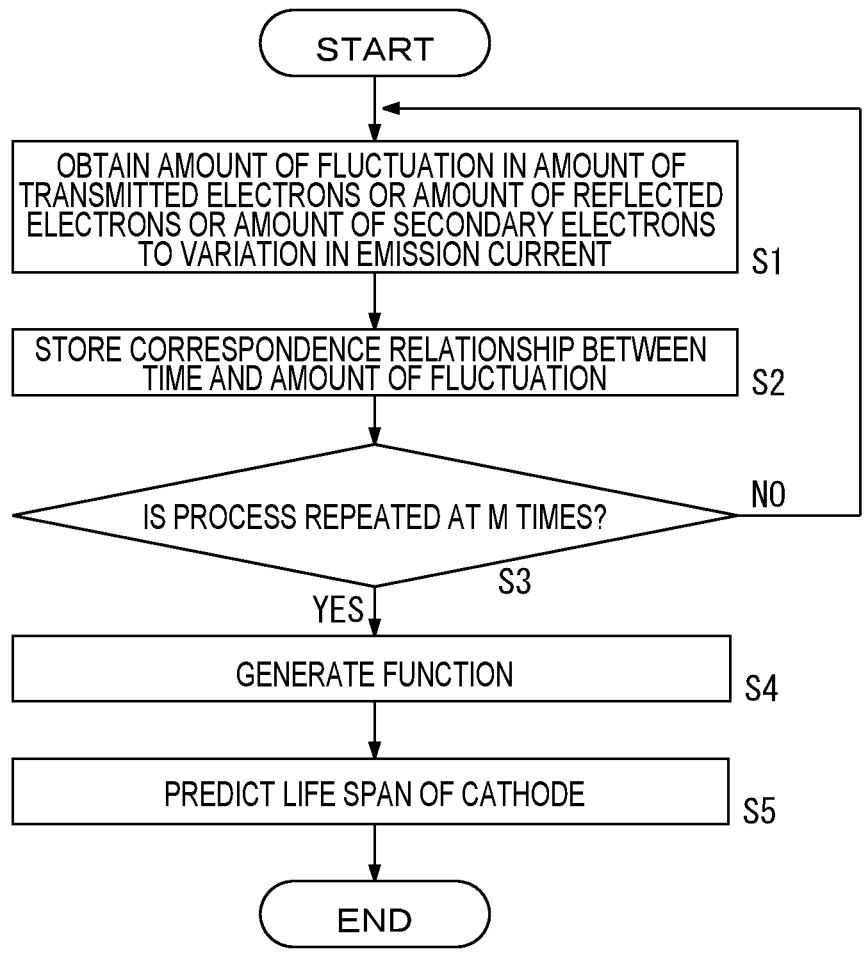
FIG. 4 is a flowchart showing a function generation procedure in a first prediction method.

FIGS. 3A and 3B are diagrams illustrating a first prediction method, and FIG. 4 is a flowchart showing the process procedure of the first prediction method. In the first prediction method, as shown in FIG. 3A, the correspondence relationship between the cathode condition and the beam characteristic is plotted. In the example in FIG. 3A, when an electron beam is emitted from the electron gun 7 of the electron beam writing apparatus 2, the value of the amount of transmitted electrons, the amount of reflected electrons, or the amount of secondary electrons when the emission current is changed is plotted with the emission current that is the cathode condition on the horizontal axis and the amount of transmitted electrons, the amount of reflected electrons, or the amount of secondary electrons that is the beam characteristic on the vertical axis. As shown in FIG. 3A, the plots are generally disposed on a common straight line. That is, the amount of fluctuation of the amount of transmitted electrons, the amount of reflected electrons, or the amount of secondary electrons to a variation in the emission current becomes substantially a constant value while the cathode 21 does not reach its life span. The above-described process of obtaining the amount of fluctuation is repeated at a plurality of times over a predetermined period (e.g., several months).

In FIG. 3B, the horizontal axis represents time and the vertical axis represents the above-described amount of fluctuation, and the correspondence relationship between the time at which the amount of fluctuation in FIG. 3A is obtained and the amount of fluctuation is plotted. FIG. 3B shows a plurality of plots, and each plot indicates a value of the amount of fluctuation in each period in which the process in FIG. 3A is performed.

The above-described function generator 45 generates the function expressed by a polynomial, for example, by a fitting process, based on plots of FIG. 3B. The fitting function may be generated by a past actual measurement value similarly to the first prediction method. Otherwise, the fitting function may be generated by a simulation. Here, a fitting parameter is generated by the fitting process and an extrapolation process. In the present embodiment, for example, a quadratic function may be preferably used as the fitting function. In the function in FIG. 3B, the value of the amount of fluctuation on the vertical axis decreases with a lapse of time. This indicates that a variation in the amount of transmitted electrons, the amount of reflected electrons, or the amount of secondary electrons to a variation in the emission current gradually decreases with time. The reason for such characteristics is that when the cathode 21 comes close to its life span, the amount of transmitted electrons, the amount of reflected electrons, or the amount of secondary electrons passing through each aperture does not increase even though the emission current increases.

The prediction unit 44 determines that the time at which the function generated by the function generator 45 intersects with the threshold indicated by the broken line in FIG. 3B is the life span of the cathode 21, and thus the replacement of the cathode 21 can be urged before this time is reached.

The threshold is set based on, for example, a result of performing a plurality of times of processing of obtaining a value of an amount of fluctuation of the amount of transmitted electrons, the amount of reflected electrons, or the amount of secondary electrons to a variation in the emission current from the start of using the cathode 21 to the end of life span. Alternatively, a function may be generated by simulation, and the threshold may be determined from the curve shape of the function.

In FIG. 3A, the values of the amount of transmitted electrons, the amount of reflected electrons, or the amount of secondary electrons when the emission current is changed are plotted. However, the horizontal axis may indicate other cathode conditions such as a bias voltage instead of the emission current. In addition, the vertical axis may be another beam characteristic such as a beam size on the sample surface instead of the amount of transmitted electrons, the amount of reflected electrons, or the amount of secondary electrons.

FIG. 4 is a flowchart showing a function generation procedure in the first prediction method. First, the emission current is changed at a certain time, and a value of the amount of fluctuation of the amount of transmitted electrons, the amount of reflected electrons, or the amount of secondary electrons to a variation in the emission current is obtained (Step S1). As described above, it may take a period such as several months to obtain the amount of fluctuation in Step S1. Subsequently, the correspondence relationship between the time at which the process in Step S1 is performed and the value of the amount of fluctuation is temporarily stored in a storage device (not shown) (Step S2).

Subsequently, it is determined whether the processes in Steps S1 and S2 are repeated at M times (M is an integer of two or more) (Step S3). The processes in Steps S1 to S3 are repeated until the number of repetitions reaches M times. That is, for example, the process of obtaining the amount of fluctuation is repeated M times over several months. When the number of times reaches M, the correspondence relationship between the time of M times stored in the storage device in Step S2 and the value of the amount of fluctuation is plotted in a two-dimensional coordinate space in which the horizontal axis represents time and the vertical axis represents the value of the amount of fluctuation as shown in FIG. 3B.

Subsequently, a fitting process and an extrapolation process are performed based on a plurality of plots, and a function as shown in FIG. 3B is generated (Step S4). The process in Step S4 is performed by the function generator 45. Since the function generated in Step S4 obtains the value of the amount of fluctuation using the time as a parameter and can be expressed by a predetermined formula or table, a predetermined formula or table representing the function is stored in the storage device in Step S4.

Subsequently, the life span of the cathode 21 is determined by the extrapolation process of the function generated in Step S4 (Step S5). The process in Step S5 is performed by the prediction unit 44. The broken line in FIG. 3B indicates the threshold, and the time at which the function intersects with the threshold represents the life span of the cathode 21. The threshold may be determined in advance, or the threshold may be set according to the curve shape of the function. In practice, before the life span of the cathode 21 is reached, the life span of the cathode 21 is predicted from the newly measured plot position on the function to replace the cathode 21 before the life span is reached.

As described above, in the first prediction method, the magnitude of the amount of fluctuation of the beam characteristic to a variation in the cathode condition is obtained at each of the plurality of times, the function is generated from the obtained value, and the life span of the cathode 21 is predicted from the time at which the function intersects with the threshold. As a result, it is possible to accurately predict the replacement time of the cathode 21 before the cathode 21 actually reaches its life span in consideration of the cathode conditions and the beam characteristics.

Second Prediction Method

Figure 5A:
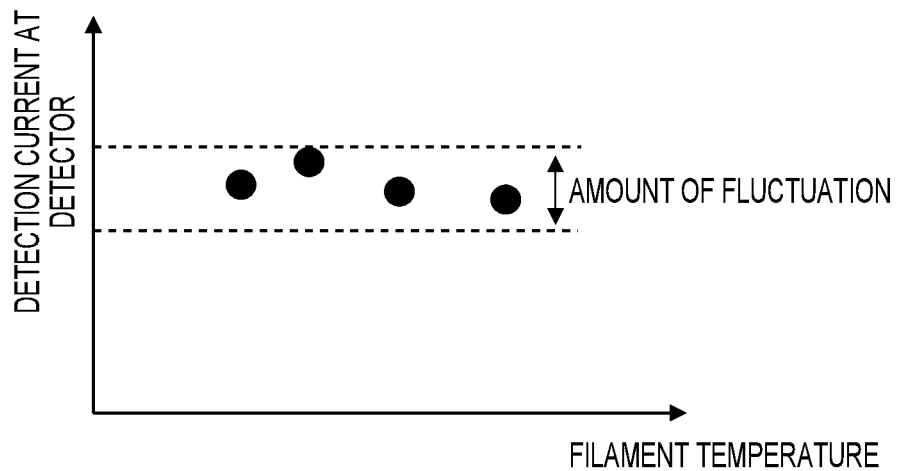
FIG. 5A is a graph plotting a correspondence relationship between cathode conditions and beam characteristics.
Figure 5B:
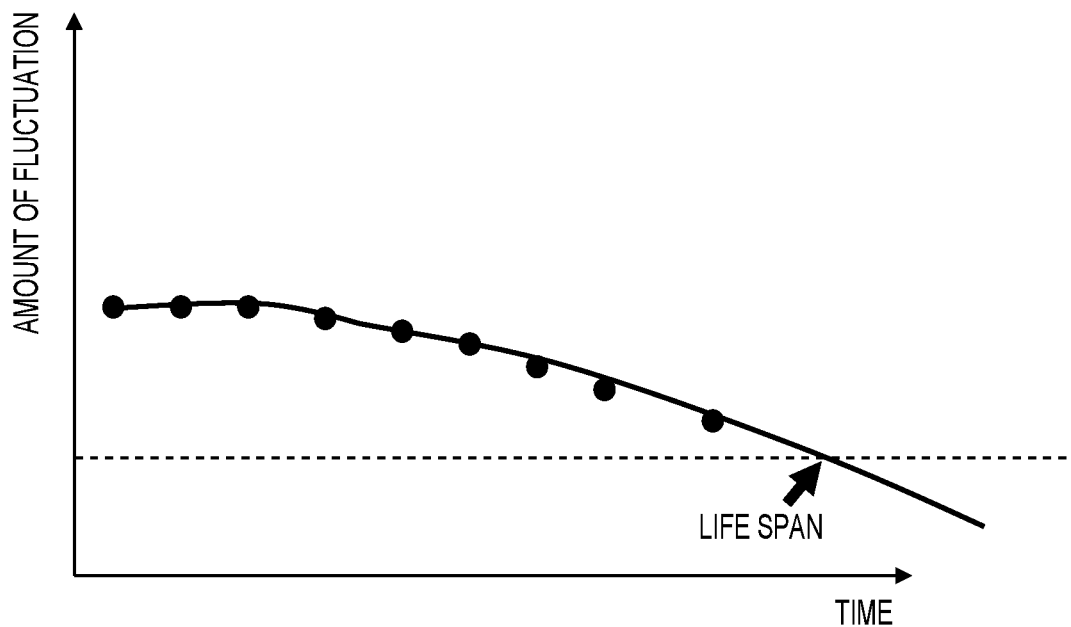
FIG. 5B is a graph plotting a correspondence relationship between the time at which the amount of fluctuation in FIG. 5A is obtained and the amount of fluctuation.
Figure 6:
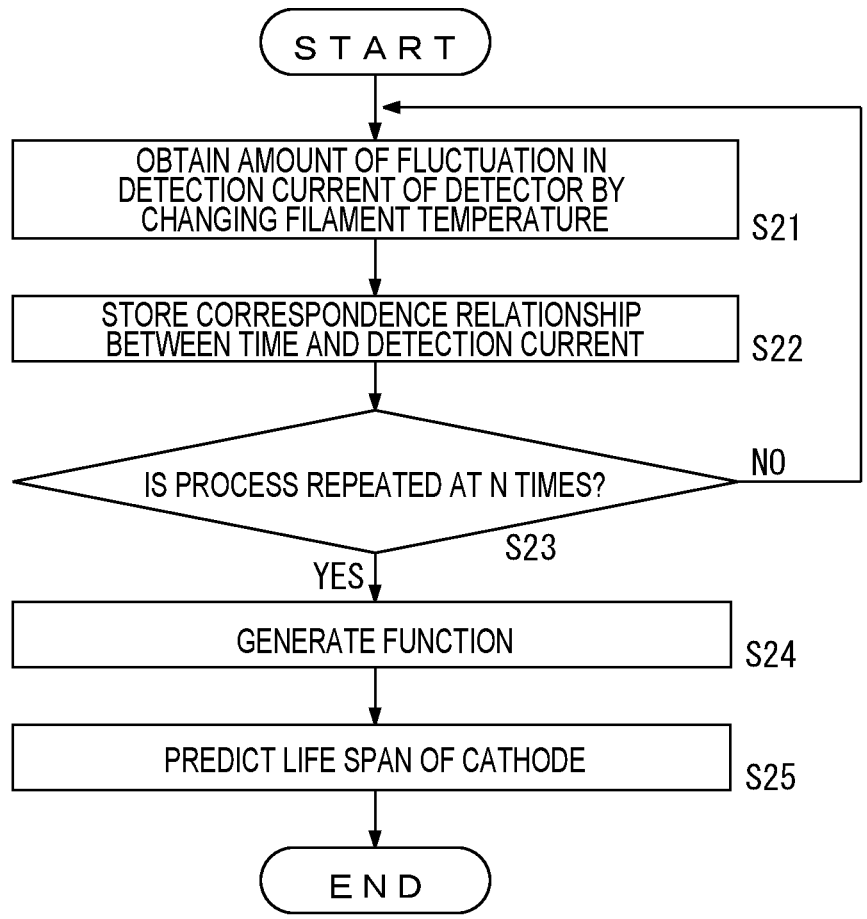
FIG. 6 is a flowchart showing a function generation procedure in a second prediction method.

FIGS. 5A and 5B are diagrams illustrating the second prediction method, and FIG. 6 is a flowchart showing the process procedure of the second prediction method. In the second method, as shown in FIG. 5A, the correspondence relationship between the cathode condition and the beam characteristic is plotted. In the example in FIG. 5A, when an electron beam is emitted from the electron gun 7 of the electron beam writing apparatus 2, the value of the detection current when the filament temperature is changed is plotted with the filament temperature that is the cathode condition on the horizontal axis and the detection current of the detector 46 that is the beam characteristic on the vertical axis, and the amount of fluctuation of the detection current when the filament temperature is changed is detected.

Similarly to the first prediction method, the cathode condition includes, for example, at least one of the emission current carried through the emitter 23, the bias voltage applied to the filament 25, the filament power supplied to the filament 25, and the temperature of the filament 25. In addition, the temporal change in the amount of fluctuation of the beam characteristic includes at least one of the amount of transmitted electrons of the aperture, the amount of the current of reflected electrons, the amount of the current of secondary electrons, and a variation in the bias voltage applied to the filament 25 of the cathode 21.

FIG. 5B plots the correspondence relationship between the time at which the amount of fluctuation in FIG. 5A is obtained and the amount of fluctuation with the horizontal axis representing time and the vertical axis representing the amount of fluctuation of the detection current described above. FIG. 5B shows a plurality of plots, and each plot indicates the amount of fluctuation of the detection current at the time at which the process in FIG. 5A is performed.

The function generator 45 generates a function expressed by the polynomial by a fitting process based on all the plots in FIG. 5B. The fitting function is generated by the past actual measurement value similarly to the first prediction method. Otherwise, the fitting function may be generated by the simulation. Here, the fitting process and the extrapolation process are performed based on all the plots to generate the fitting parameter. In the function in FIG. 5B, the amount of fluctuation on the vertical axis decreases with a lapse of time. This indicates that as the cathode 21 comes close to its life span, the detection current does not change much even though the filament temperature is changed, and the sensitivity decreases. Therefore, the time at which the function generated by the function generator 45 intersects with the threshold indicated by the broken line in FIG. 5B is determined as the life span of the cathode 21, and thus the cathode 21 can be replaced at an appropriate time before the cathode 21 reaches its life span. As described above, in the second prediction method, the condition controller 43 changes the condition under which the electron beam is emitted from the cathode 21 in a plurality of ways. The prediction unit 44 predicts the life span of the cathode 21 based on a temporal change in the amount of fluctuation of the beam characteristic when the condition is changed in a certain range. More specifically, the function generator 45 generates a function that obtains a temporal change in the amount of fluctuation of the beam characteristic when the cathode condition is changed at each of the plurality of times. The prediction unit 44 determines that the life span of the cathode 21 is reached at the time at which a temporal change in the amount of fluctuation obtained by the function generated by the function generator 45 becomes a predetermined threshold.

The threshold in FIG. 5B is set based on the amount of fluctuation of the detection current of the cathode 21 that actually reaches the end of life span, similarly to the threshold in FIG. 3B. Alternatively, a function may be generated by simulation, and the threshold may be determined from the curve shape of the function.

FIG. 6 is a flowchart showing a function generation procedure in the second prediction method. First, the filament temperature is changed at a certain time to obtain the amount of fluctuation of the detection current of the detector 46 (Step S21). Subsequently, the correspondence relationship between the time at which the process in Step S21 is performed and the detection current of the detector 46 is temporarily stored in the storage device (not shown) (Step S22).

Subsequently, it is determined whether the processes in Steps S21 and S22 are repeated at N times (N is an integer of two or more) (Step S23). The processes in Steps S21 to S23 are repeated until the number of repetitions reaches N times. When the number of times reaches N, the correspondence relationship between the time of N times stored in the storage device in Step S22 and the value of the amount of fluctuation is plotted in a two-dimensional coordinate space in which the horizontal axis represents time and the vertical axis represents the amount of fluctuation value as shown in FIG. 5B.

Subsequently, the fitting process and extrapolation process for a plurality of plots in the two-dimensional coordinate space are performed to generate a function as shown in FIG. 5B (Step S24). Since the function generated in Step S24 obtains the amount of fluctuation of the detection current using the time as a parameter and can be expressed by a predetermined formula or table, a predetermined formula or table corresponding to the function is stored in the storage device in Step S24.

Subsequently, the life span of the cathode 21 is determined based on the function generated in Step S24 (Step S25). The broken line in FIG. 5B indicates the threshold, and the time at which the function intersects with the threshold represents the life span of the cathode 21. The threshold may be determined in advance, or the threshold may be set according to the curve shape of the function. In practice, before the life span of the cathode 21 is reached, the life span of the cathode 21 is predicted from the newly measured plot position on the function to replace the cathode 21 before the life span is reached.

As described above, in the second prediction method, the amount of fluctuation of the detection current of the detector 46 is obtained at each of the plurality of times, the function is generated from the obtained amount of fluctuation, and the replacement time of the cathode 21 is predicted from the time at which the function intersects with the threshold. As a result, it is possible to accurately predict the replacement time of the cathode 21 in consideration of the cathode conditions and the beam characteristics.

In both the first prediction method and the second prediction method described above, the life span of the cathode 21 is predicted based on a change in the beam characteristics when the cathode conditions are changed in a plurality of ways, and thus it is possible to accurately predict the life span of the cathode 21 before the cathode 21 reaches its life span.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. An electron beam writing apparatus comprising:
   a cathode configured to emit an electron beam;
   a condition controller configured to change a condition under which the electron beam is emitted from the cathode in a plurality of ways; and
   a prediction unit configured to predict a life span of the cathode based on a temporal change in an amount of fluctuation of a beam characteristic of the electron beam to a change in the condition when the condition is changed.

2. The electron beam writing apparatus according to claim 1, comprising
   a function generator configured to generate a function that obtains a temporal change in an amount of fluctuation of a beam characteristic of the electron beam to a change in the condition at an arbitrary time based on a temporal change in the amount of fluctuation of the beam characteristic of the electron beam to a change in the condition at each of a plurality of times, wherein
   the prediction unit determines that the life span of the cathode is reached at a time when a temporal change in the amount of fluctuation of the beam characteristic of the electron beam to a change in the condition obtained by the function becomes a predetermined threshold.

3. The electron beam writing apparatus according to claim 2, wherein
the function generator generates the function by a fitting process using a fitting function generated in advance based on time difference of the amount of fluctuation of the beam characteristic of the electron beam to the change in the condition at each of the plurality of times.

4. The electron beam writing apparatus according to claim 3, wherein
the fitting function is generated based on a past actual measurement value.

5. The electron beam writing apparatus according to claim 1, wherein
the cathode has a filament and an emitter connected to the filament, and
the condition includes at least one of an emission current carried through the emitter, a bias voltage applied to the filament, filament power supplied to the filament, and a temperature of the filament.

6. The electron beam writing apparatus according to claim 5, wherein
the amount of fluctuation of the beam characteristic is an amount of a variation of at least one of an amount of transmitted electrons of an aperture, an amount of a current of reflected electrons, an amount of a current of secondary electrons, and a bias voltage applied to the filament of the cathode.

7. The electron beam writing apparatus according to claim 1, wherein
the temporal change in the amount of fluctuation of the beam characteristic is the amount of fluctuation of the beam characteristic in a minimum unit of control of a high-voltage power supply for supplying power to the cathode.

8. An electron beam writing apparatus comprising:
a cathode configured to emit an electron beam;
a condition controller configured to change a condition under which the electron beam is emitted from the cathode in a plurality of ways; and
a prediction unit configured to predict a life span of the cathode based on a temporal change in an amount of fluctuation of a beam characteristic of the electron beam when the condition is changed in a certain range.

9. The electron beam writing apparatus according to claim 8, comprising
a function generator configured to generate a function that obtains an amount of fluctuation of a beam characteristic when the condition is changed at each of a plurality of times, wherein
the prediction unit determines that the life span of the cathode is reached at time when the amount of fluctuation obtained by the function becomes a predetermined threshold.

10. The electron beam writing apparatus according to claim 8, wherein
the function generator generates the function by a fitting process using a fitting function generated in advance based on time difference of the amount of fluctuation of the beam characteristic to the change in the condition at each of the plurality of times.

11. The electron beam writing apparatus according to claim 9, wherein
the fitting function is generated based on a past actual measurement value.

12. The electron beam writing apparatus according to claim 8, wherein
the cathode has a filament and an emitter connected to the filament, and
the condition includes at least one of an emission current carried through the emitter, a bias voltage applied to the filament, filament power supplied to the filament, and a temperature of the filament.

13. The electron beam writing apparatus according to claim 12, wherein
the amount of fluctuation of the beam characteristic is an amount of a variation of at least one of an amount of transmitted electrons of an aperture, an amount of a current of reflected electrons, an amount of a current of secondary electrons, and a bias voltage applied to the filament of the cathode.

14. A cathode life span prediction method comprising:
changing a condition under which an electron beam is emitted from a cathode configured to emit the electron beam in a plurality of ways; and
predicting a life span of the cathode based on a temporal change in a ratio of an amount of fluctuation of a beam characteristic of the electron beam to a variation in the condition when the condition is changed in a plurality of ways.

15. The cathode life span prediction method according to claim 14, wherein
the condition under which the electron beam is emitted from the cathode is changed in a plurality of ways, and
the life span of the cathode is predicted based on a temporal change in an amount of fluctuation of the beam characteristic when the condition is changed in a certain range.

16. The cathode life span prediction method according to claim 14, wherein
a function that obtains a temporal change in an amount of fluctuation of a beam characteristic of the electron beam to a change in the condition at an arbitrary time is generated based on a temporal change in an amount of fluctuation of the beam characteristic of the electron beam to a change in the condition at each of a plurality of times, and
determination is made that the life span of the cathode is reached at a time when a temporal change in the amount of fluctuation of the beam characteristic of the electron beam to a change in the condition obtained by the function becomes a predetermined threshold.

17. The cathode life span prediction method according to claim 16, wherein
the function is generated by a fitting process using a fitting function generated in advance based on time difference of the amount of fluctuation of the beam characteristic of the electron beam to the change in the condition at each of the plurality of times.

18. The cathode life span prediction method according to claim 17, wherein
the fitting function is generated based on a past actual measurement value.

19. The cathode life span prediction method according to claim 14, wherein
the cathode has a filament and an emitter connected to the filament, and
the condition includes at least one of an emission current carried through the emitter, a bias voltage applied to the filament, filament power supplied to the filament, and a temperature of the filament.

20. The cathode life span prediction method according to claim 19, wherein
the amount of fluctuation of the beam characteristic is an amount of a variation of at least one of an amount of transmitted electrons of an aperture, an amount of a current of reflected electrons, an amount of a current of secondary electrons, and a bias voltage applied to the filament of the cathode.

\* \* \* \* \*